United States Patent
Ruiz et al.

(10) Patent No.: US 11,753,038 B2
(45) Date of Patent: Sep. 12, 2023

(54) ENHANCED VEHICLE AND TRAILER OPERATION

(71) Applicant: Ford Global Technologies, LLC, Dearborn, MI (US)

(72) Inventors: J. Elias Ruiz, Atizapan/Estado de Mexico (MX); Sergio Becerril, Mexico City (MX); Mijail Avila, Cuautitlan Izcalli/Estado de Mexico (MX); Veronica Garza, Mexico City (MX); Cesar Sanchez Razo, Tlalnepantla de Baz/Estado de México (MX)

(73) Assignee: Ford Global Technologies, LLC, Dearborn, MI (US)

( * ) Notice: Subject to any disclaimer, the term of this patent is extended or adjusted under 35 U.S.C. 154(b) by 300 days.

(21) Appl. No.: 17/180,967

(22) Filed: Feb. 22, 2021

(65) Prior Publication Data
US 2022/0266866 A1 Aug. 25, 2022

(51) Int. Cl.
| | |
|---|---|
| *B60W 60/00* | (2020.01) |
| *B60D 1/36* | (2006.01) |
| *G01R 31/44* | (2020.01) |
| *B60W 40/12* | (2012.01) |
| *B60W 30/18* | (2012.01) |
| *B60Q 1/50* | (2006.01) |

(52) U.S. Cl.
CPC .......... *B60W 60/0025* (2020.02); *B60D 1/36* (2013.01); *B60Q 1/50* (2013.01); *B60W 30/18009* (2013.01); *B60W 40/12* (2013.01); *G01R 31/44* (2013.01)

(58) Field of Classification Search
None
See application file for complete search history.

(56) References Cited

U.S. PATENT DOCUMENTS

| | | | |
|---|---|---|---|
| 6,217,177 B1 * | 4/2001 | Rost ........................ | B60R 1/025 359/872 |
| 6,864,782 B1 * | 3/2005 | Aaron .................... | B60Q 1/305 340/431 |
| 7,353,103 B2 | 4/2008 | Binienda et al. | |
| | (Continued) | | |

FOREIGN PATENT DOCUMENTS

| | | |
|---|---|---|
| CN | 103295117 A | 9/2013 |
| CN | 110501598 A | 11/2019 |
| | (Continued) | |

OTHER PUBLICATIONS

Machine Translation of DE 102018221863 (Year: 2020).*
"Trailering App Trailer Connection and Lighting Diagnosis Update", Dec. 14, 2020, TechLink, https://gm-techlnk.com/.

*Primary Examiner* — Christian Chace
*Assistant Examiner* — Scott R Jagolinzer
(74) *Attorney, Agent, or Firm* — Frank Lollo; Bejin Bieneman PLC

(57) ABSTRACT

An electrical resistance of a lamp in communication with a computer is determined. A respective classification for each of the electrical resistance, a vehicle length, and a trailer length is determined. Each classification is associated to a respective range of values of one of the electrical resistance, the vehicle length, or the trailer length. Based on the classifications a trailer that is attached to a vehicle is detected. One or more components of the vehicle are actuated to move the trailer.

20 Claims, 5 Drawing Sheets

(56) References Cited

U.S. PATENT DOCUMENTS

| | | | |
|---|---|---|---|
| 2009/0313096 A1* | 12/2009 | Kaga | G07B 15/063 |
| | | | 705/13 |
| 2013/0261843 A1* | 10/2013 | Kossira | B60T 8/172 |
| | | | 701/1 |
| 2019/0179010 A1* | 6/2019 | Nasser | G01S 13/931 |
| 2019/0329821 A1* | 10/2019 | Ziebart | B60R 1/00 |
| 2019/0359018 A1 | 11/2019 | Brickley et al. | |
| 2020/0174055 A1 | 6/2020 | Pampattiwar et al. | |
| 2021/0042955 A1* | 2/2021 | Lee | B60R 11/04 |

FOREIGN PATENT DOCUMENTS

| | | | | |
|---|---|---|---|---|
| DE | 102015214337 | B3 | 2/2017 | |
| DE | 102018115178 | A1 | 1/2020 | |
| DE | 102018221863 | A1 * | 6/2020 | |
| EP | 2377723 | A1 | 10/2011 | |
| EP | 3637137 | A1 * | 4/2020 | G01S 13/04 |

\* cited by examiner

ENHANCED VEHICLE AND TRAILER OPERATION

BACKGROUND

Vehicles can be equipped with computing devices, networks, sensors and controllers to acquire data regarding the vehicle's environment and to operate the vehicle based on the data. Vehicle sensors can provide data concerning objects attached to the vehicles, such as trailers, trailer lights, and trailer sensors. Operation of the vehicle can rely upon acquiring accurate and timely data regarding attached objects that move with the vehicle while the vehicle is being operated on a roadway.

DETAILED DESCRIPTION

Figure 1:
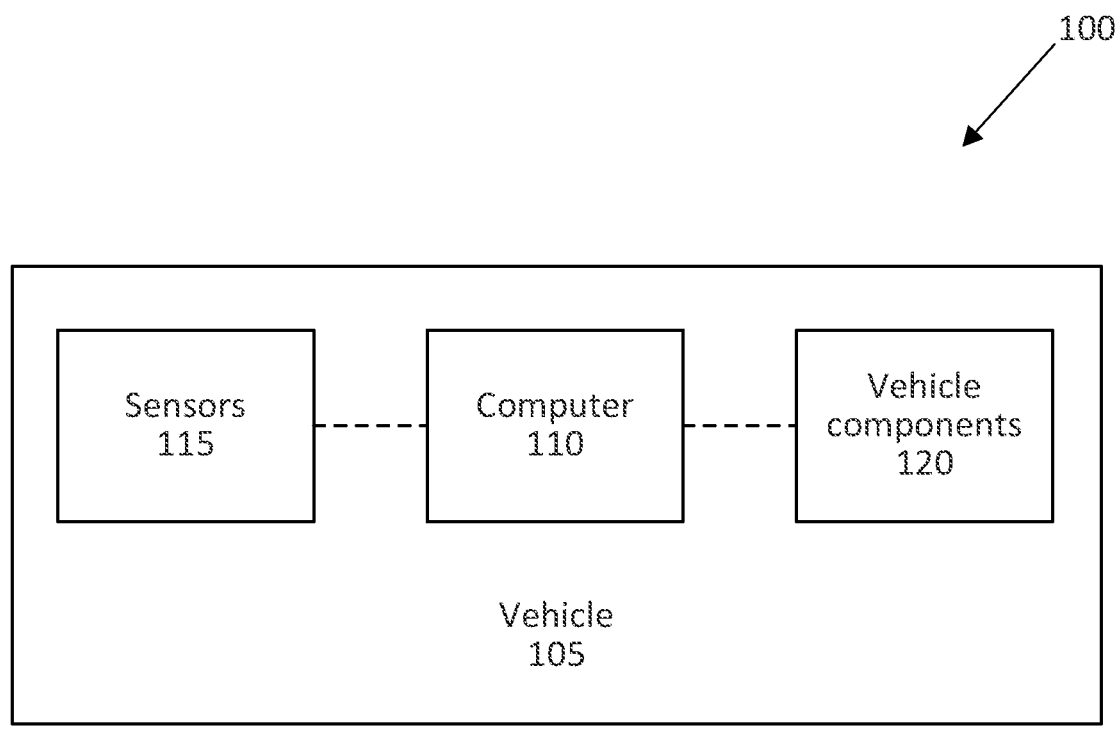
FIG. 1 is a block diagram of an example system for detecting a trailer attached to a vehicle.

A system includes a computer including a processor and a memory, the memory storing instructions executable by the processor to determine an electrical resistance of a lamp in communication with the computer, determine a respective classification for each of the electrical resistance, a vehicle length, and a trailer length, each classification associated to a respective range of values of one of the electrical resistance, the vehicle length, or the trailer length, based on the classifications, determine that a trailer is attached to a vehicle, and actuate one or more components of the vehicle to move the trailer.

The instructions can further include instructions to determine the electrical resistance of the lamp based on a voltage across the lamp or a current supplied to the lamp.

The instructions can further include instructions to determine that a connector connecting the vehicle to the trailer is corroded based on the classification.

The instructions can further include instructions to determine that the trailer is not attached to the vehicle upon determining that the connector is corroded.

The instructions can further include instructions to adjust a blind spot subsystem upon determining that the trailer is attached to the vehicle.

The instructions can further include instructions to actuate one or more components of the vehicle to move the trailer in reverse upon determining that the trailer is attached to the vehicle.

The lamp can be mounted to the trailer.

The instructions can further include instructions to determine the classifications with a fuzzy logic program.

The fuzzy logic program can output one of a plurality of classifications based on the vehicle length, the plurality of classifications including at least one of a compact classification, a crossover vehicle classification, or a truck classification.

The fuzzy logic program can output one of a plurality of classifications based on the electrical resistance, the plurality of classifications including at least one of an open circuit, a short circuit, a corroded connector, an incandescent lamp, or a light-emitting diode lamp.

The instructions can further include instructions to determine that the trailer is attached to the vehicle when the output classification is the short circuit classification and to determine that no trailer is attached to the vehicle when the output classification is the corroded classification.

The instructions can further include instructions to receive user input indicating the trailer length of the trailer.

A method includes determining an electrical resistance of a lamp, determining a respective classification for each of the electrical resistance, a vehicle length, and a trailer length, each classification associated to a respected range of values of one of the electrical resistance, the vehicle length, or the trailer length, based on the classifications, determining that a trailer is attached to a vehicle, and actuating one or more components of the vehicle to move the trailer.

The method can further include determining the electrical resistance of the lamp based on a voltage across the lamp or a current supplied to the lamp.

The method can further include determining that a connector connecting the vehicle to the trailer is corroded based on the classification.

The method can further include determining that the trailer is not attached to the vehicle upon determining that the connector is corroded.

The method can further include adjusting a blind spot subsystem upon determining that the trailer is attached to the vehicle.

The method can further include actuating one or more components of the vehicle to move the trailer in reverse upon determining that the trailer is attached to the vehicle.

The method can further include determining the classifications with a fuzzy logic program.

The method can further include determining that the trailer is attached to the vehicle when the output classification is the short circuit classification and determining that no trailer is attached to the vehicle when the output classification is the corroded classification.

The method can further include receiving user input indicating the trailer length of the trailer.

Further disclosed is a computing device programmed to execute any of the above method steps. Yet further disclosed is a vehicle comprising the computing device. Yet further disclosed is a computer program product, comprising a computer readable medium storing instructions executable by a computer processor, to execute any of the above method steps.

When a trailer is attached to a vehicle, the trailer adds weight for a vehicle propulsion and length to be accounted for in vehicle maneuvers. A computer of the vehicle can actuate components to move the vehicle and the trailer based on the additional weight and length. For example, the computer can actuate a steering and a propulsion to move the vehicle and the trailer in reverse along an intended path of a vehicle operator. To actuate components to move the trailer, the computer detects that the trailer is attached to the vehicle.

To detect the trailer, the computer collects electrical resistance data from a lamp on the trailer, length data of the vehicle, and length data of trailers previously attached to the vehicle. The computer inputs the collected data to a fuzzy logic program that classifies the data to one of a plurality of classifications for electrical resistance, vehicle length, and trailer length. Based on the classifications, the computer can determine whether the trailer is attached to the vehicle. Upon determining that the trailer is attached to the vehicle, the computer can actuate one or more components to move the vehicle and the trailer. For example, the computer can use a backup assist program to move the trailer and the vehicle in reverse along a path intended by the vehicle operator. By using the electrical resistance data in combination with other inputs such as vehicle length and length data of prior trailers as mentioned above, to determine whether the trailer is attached to the vehicle, the computer can more reliably detect the trailer. For example, by combining electrical data with vehicle and/or trailer length inputs, present techniques avoid false positives that can be caused by using electrical data alone, e.g., electrical data may falsely match detecting a trailer when in fact an electrical signal is affected by a corroded or polluted connection.

FIG. 1 illustrates an example system 100 for detecting a trailer attached to a vehicle 105. A computer 110 in the vehicle 105 is programmed to receive collected data from one or more sensors 115. For example, vehicle 105 data may include a location of the vehicle 105, data about an environment around a vehicle, data about an object outside the vehicle such as another vehicle, etc. A vehicle 105 location is typically provided in a conventional form, e.g., geo-coordinates such as latitude and longitude coordinates obtained via a navigation system that uses the Global Positioning System (GPS). Further examples of data can include measurements of vehicle 105 systems and components, e.g., a vehicle 105 velocity, a vehicle 105 trajectory, etc.

The computer 110 is generally programmed for communications on a vehicle 105 network, e.g., including a conventional vehicle 105 communications bus such as a CAN bus, LIN bus, etc., and or other wired and/or wireless technologies, e.g., Ethernet, WIFI, etc. Via the network, bus, and/or other wired or wireless mechanisms (e.g., a wired or wireless local area network in the vehicle 105), the computer 110 may transmit messages to various devices in a vehicle 105 and/or receive messages from the various devices, e.g., controllers, actuators, sensors, etc., including sensors 115. Alternatively or additionally, in cases where the computer 110 actually comprises multiple devices, the vehicle network may be used for communications between devices represented as the computer 110 in this disclosure. For example, the computer 110 can be a generic computer with a processor and memory as described above and/or may include a dedicated electronic circuit including an ASIC that is manufactured for a particular operation, e.g., an ASIC for processing sensor data and/or communicating the sensor data. In another example, computer 110 may include an FPGA (Field-Programmable Gate Array) which is an integrated circuit manufactured to be configurable by an occupant. Typically, a hardware description language such as VHDL (Very High Speed Integrated Circuit Hardware Description Language) is used in electronic design automation to describe digital and mixed-signal systems such as FPGA and ASIC. For example, an ASIC is manufactured based on VHDL programming provided pre-manufacturing, whereas logical components inside an FPGA may be configured based on VHDL programming, e.g. stored in a memory electrically connected to the FPGA circuit. In some examples, a combination of processor(s), ASIC(s), and/or FPGA circuits may be included in computer 110.

In addition, the computer 110 may be programmed for communicating with a network, which may include various wired and/or wireless networking technologies, e.g., cellular, Bluetooth®, Bluetooth® Low Energy (BLE), wired and/or wireless packet networks, etc.

The memory can be of any type, e.g., hard disk drives, solid state drives, servers, or any volatile or non-volatile media. The memory can store the collected data sent from the sensors 115. The memory can be a separate device from the computer 110, and the computer 110 can retrieve information stored by the memory via a network in the vehicle 105, e.g., over a CAN bus, a wireless network, etc. Alternatively or additionally, the memory can be part of the computer 110, e.g., as a memory of the computer 110.

Sensors 115 can include a variety of devices. For example, various controllers in a vehicle 105 may operate as sensors 115 to provide data via the vehicle 105 network or bus, e.g., data relating to vehicle speed, acceleration, location, subsystem and/or component status, etc. Further, other sensors 115 could include cameras, motion detectors, etc., i.e., sensors 115 to provide data for evaluating a position of a component, evaluating a slope of a roadway, etc. The sensors 115 could, without limitation, also include short range radar, long range radar, LIDAR, and/or ultrasonic transducers.

Collected data can include a variety of data collected in a vehicle 105. Examples of collected data are provided above, and moreover, data are generally collected using one or more sensors 115, and may additionally include data calculated therefrom in the computer 110, and/or at a server. In general, collected data may include any data that may be gathered by the sensors 115 and/or computed from such data.

The vehicle 105 can include a plurality of vehicle components 120. In this context, each vehicle component 120 includes one or more hardware components adapted to perform a mechanical function or operation—such as moving the vehicle 105, slowing or stopping the vehicle 105, steering the vehicle 105, etc. Non-limiting examples of components 120 include a propulsion component (that includes, e.g., an internal combustion engine and/or an electric motor, etc.), a transmission component, a steering component (e.g., that may include one or more of a steering wheel, a steering rack, etc.), a brake component, a park assist component, an adaptive cruise control component, an adaptive steering component, a movable seat, and the like. Components 120 can include computing devices, e.g., electronic control units (ECUs) or the like and/or computing devices such as described above with respect to the computer 110, and that likewise communicate via a vehicle 105 network.

Figure 2:
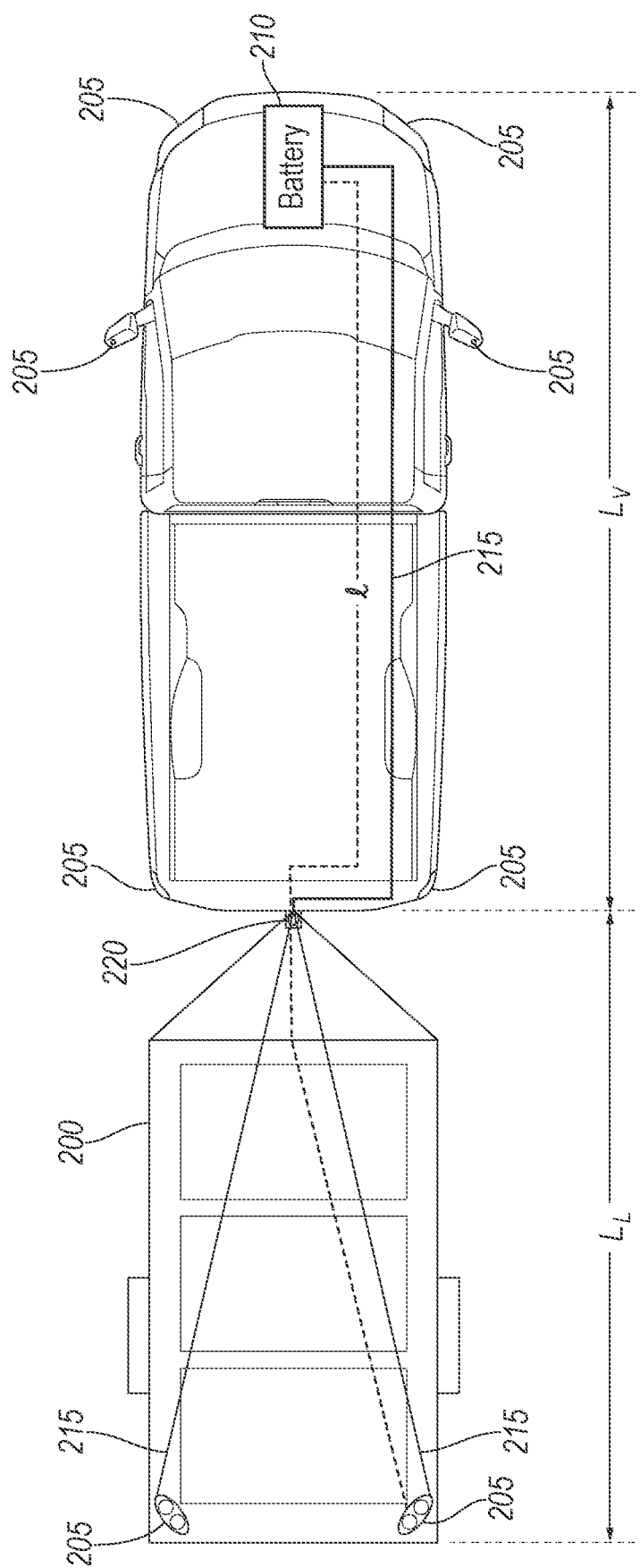
FIG. 2 is a top-down view of an example trailer attached to an example vehicle.

FIG. 2 is a top-down view of an example vehicle 105. The vehicle 105 has a length $L_V$. A trailer 200 is attached to the vehicle 105, i.e., the trailer 200 is directly mounted to the vehicle 105, and the vehicle 105 pulls the trailer 200. The trailer 200 has a length $L_T$. The trailer 200 can be, e.g., a semi-trailer, a livestock trailer, a boat trailer, a two-wheel utility trailer, a four-wheel freight trailer, etc.

The vehicle 105 can include one or more lamps 205. The lamps 205 are light sources that illuminate to provide indications and/or warnings to other vehicles 105 of an operator's intent and/or actions while operating the vehicle 105. The lamps 205 can include, e.g., a rear lamp of the vehicle 105, a rear lamp of the trailer 200, a side lamp of the vehicle 105, a front headlight of the vehicle 105, etc. The computer 110 can actuate the lamp 205 to indicate that the vehicle 105 is about to turn and/or move to an adjacent roadway lane. The lamp 205 can receive electricity from a vehicle battery 210 via a connecting wire 215. Each lamp 205 on the trailer 200 can receive electricity from a dedicated wire 215, as shown in FIG. 2. Alternatively, not shown in the Figures, more than one lamp 205 can receive electricity from a single wire 215. For example, the wire 215 can extend from the battery 210 to a first lamp 205, and then from the first lamp 205 to a second lamp 205, and then from the second lamp 205 to the battery 210.

The computer 110 can detect an electrical resistance of each lamp 205. An "electrical resistance" is a measure of reduction of current through the lamp 205, measured in Ohms. That is, as the battery 210 supplies electricity to the lamp 205, a portion of the electricity is lost as heat based on the electrical resistance of the lamp 205. The computer 110 can measure the electrical resistance of the lamp 205 by detecting at least two of a voltage V across the lamp 205 and/or a current I supplied to the lamp 205 and/or a power P supplied to the lamp 205. The computer 110 can then determine the electrical resistance R based on Ohm's Law:

$$R = \frac{V}{I} = \frac{P}{I^2} = \frac{V^2}{P}$$

for any two determined values of V, I, P. Based on the electrical resistance of the lamp 205, the computer 110 can determine whether the trailer 200 is attached to the vehicle 105, as described below.

The wire 215 has a length l, and the length l of the wire 215 can adjust the electrical resistance detected by the computer 105 as current is supplied to the lamp 205. That is, the wire 215 has an electrical resistance, and a current supplied by the battery 210 can reduce between the battery 210 and the lamp 205 from the resistance of the wire 215. Thus, the current I through the lamp 205 can be higher than a received current I* detected by the computer 110. As the length l of the wire 215 increases, the received current I* decreases, and the determined resistance R is thus less accurate for a lamp 205 on the trailer 200 that is farther from the battery 210 than a lamp 205 on the vehicle 105 closer to the battery 210. Thus, as the length L of the trailer 200 increases, the length l of the wire 215 increases to reach the lamp 205, and the computer 110 may incorrectly determine that the connector 220 is corroded based on the detected electrical resistance R. To more accurately detect whether the trailer 200 is attached to the vehicle 105, the computer 110 can use stored length L data of one or more trailers 200 that have previously been attached to the vehicle 105.

The vehicle 105 includes a connector 220. The wire(s) 215 extend through the connector 220 to transmit electricity from the battery 210 to the lamps 205. That is, the connector 220 can include one or more leads (not shown) that transmit energy from the portion of the wire(s) 215 in the vehicle 105 to the portion of the wire(s) 215 in the trailer 200. The connector 220 thus provides electricity from the battery 210 in the vehicle 105 to the lamps 205 on the trailer 200. The connector 220 can corrode, i.e., material can accumulate on the leads of the connector 220, impeding current flow and reducing the power transmitted to the lamps 205.

Figure 3:
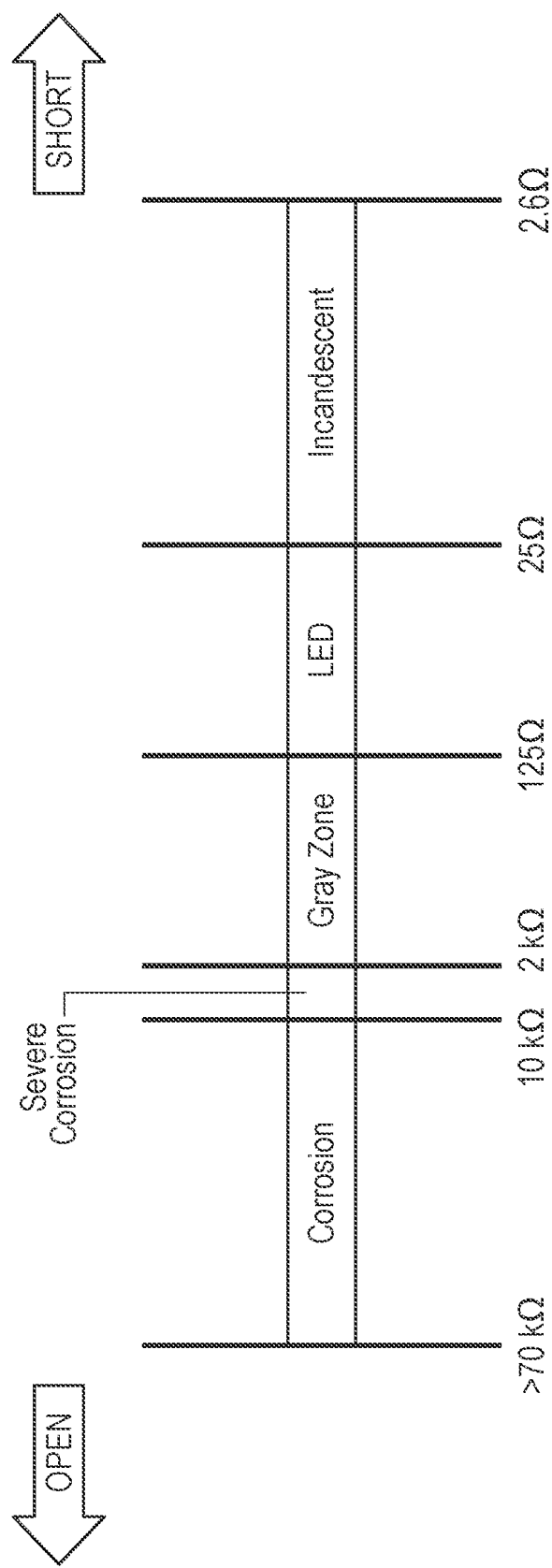
FIG. 3 is a diagram of example classifications for lamps.

FIG. 3 is a diagram of a plurality of example classifications of electrical resistance data collected by the computer 110. A "classification" in this context is text string or numerical value that indicates a type or status of the lamp 205 and/or a status of the connector 220. The computer 110 collects the electrical resistance data from, e.g., the CAN bus, and determines the classification based on the electrical resistance data. The computer 110 can use the classification to determine whether a trailer 200 is attached to the vehicle 105, e.g., with the fuzzy logic program described below and shown in FIG. 4. A type of lamp indicates a way in which the lamp 205 provides light, e.g., a type of lamp can be incandescent, LED, fluorescent, etc. A status of a lamp 205 indicates whether the lamp 205 is functioning properly and/or a manner in which proper function of the lamp is prevented. Different lamps 205 can have different electrical resistances based on, e.g., a type of lamp 205. A status of the connector 220 indicates an amount of corrosion, if any, on the connector 220. Corrosion on the connector 220 can cause a different electrical resistance detected by the computer 110 than the lamp 205. That is, the corrosion on the connector 220 can reduce current I in the wire 215, and the computer 110 can determine that the electrical resistance is greater than when the connector 220 has no corrosion. The classifications shown in FIG. 3 are exemplary and can be determined based on empirical testing of test trailers with test lamp attached to test vehicles. The empirical testing can include collecting resistance data from the test lamps, including LED and incandescent test lamps, and determining the classifications based on the collected resistance data.

Upon determining the electrical resistance, the computer 110 can classify the electrical resistance data according to a classification, such as one of the example classifications shown in FIG. 3. For example, when the electrical resistance is between 25 ohms and 125 ohms, the computer 110 can assign the classification "LED," indicating that the electrical resistance data was determined based on current from an LED lamp 205. In another example, when the electrical resistance is greater than 10 kilohms, the computer 110 can assign the classification "Corrosion" to the connector 220, indicating that the electrical resistance data was determined based on current from a connector 220 that has corroded and should be replaced. The diagram of FIG. 3 shows the classification "Severe Corrosion" for electrical resistance values less than the "Corrosion" classification. In yet another example, when the electrical resistance is 200 ohms, the computer 110 can assign the classification "Gray Zone," in which the computer 110 may not be able to determine whether the current that determined the electrical resistance was received from the connector 220 that is corroded or the connector 220 is not corroded but the length l of the wire 215 reduces the current supplied to the lamp 205 below the "LED" classification. That is, in the Gray Zone, the computer 110 may not be able to differentiate between a corroded connector 220 and current loss in the wire 215 through a functional connector 220. The computer 110 may thus, based on the electrical resistance data alone, falsely determine that the connector 220 is corroded and may not detect that the trailer 200 is attached to the vehicle 105. As described above, such false positive detections of the trailer 200 in the Gray Zone can cause the computer 110 to actuate components 120 to move a trailer 200 when no trailer 200 is attached to the vehicle 105.

As the connector 220 begins to corrode, the corroded material may impede electrical currents, causing an increase in electrical resistance into the "Corrosion" classification. As more corroded material accumulates, electrical current can begin to flow through the corroded material more readily than the uncorroded portions of the connector 220, reducing the electrical resistance. Thus, a severely corroded connector 220 may have a lower electrical resistance than a less corroded connector 220.

Figure 4:
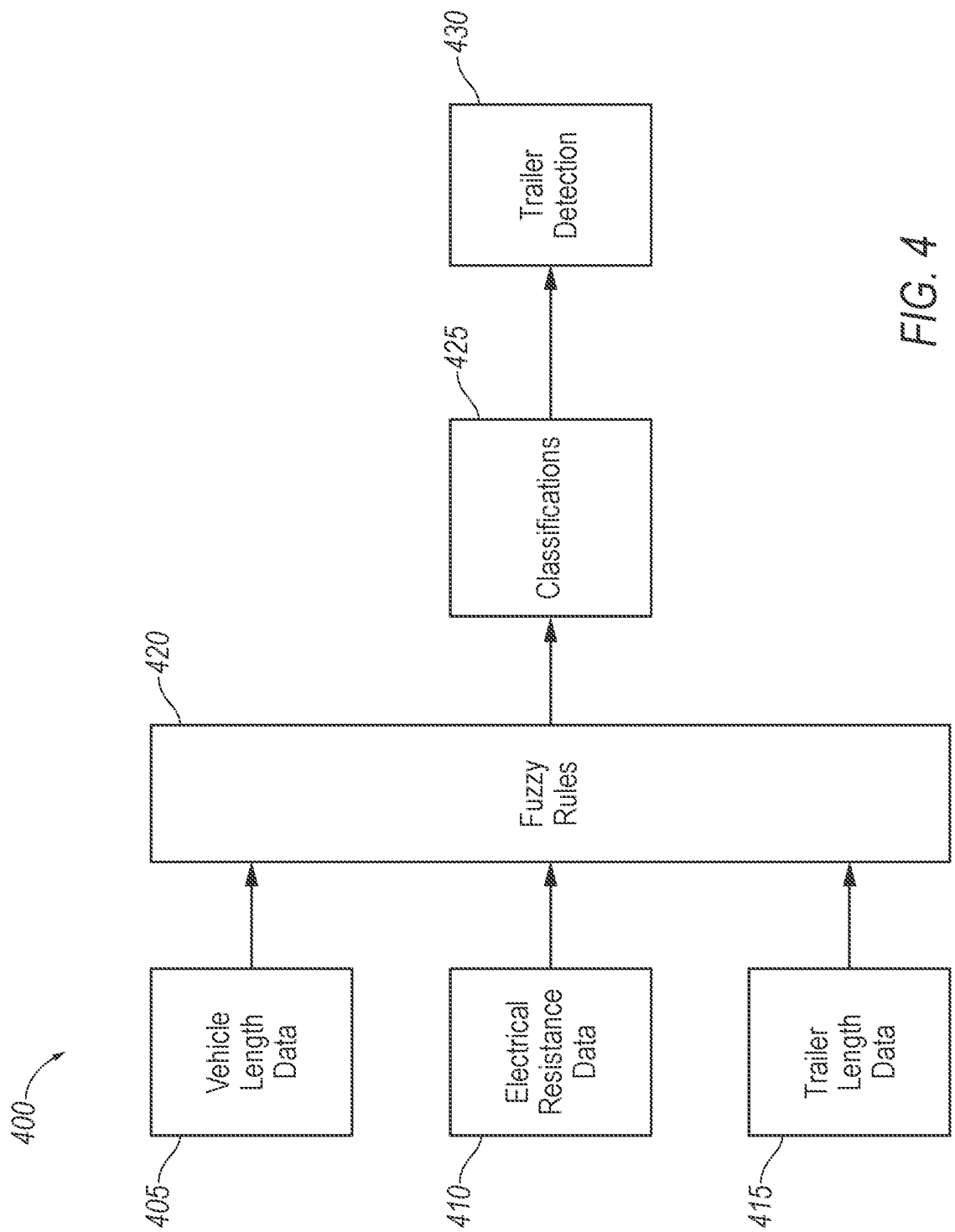
FIG. 4 is a block diagram of an example fuzzy logic program for detecting the trailer.

FIG. 4 is a block diagram of a fuzzy logic program 400 for detecting a trailer 200. A "fuzzy logic" program is programming that uses fuzzy logic to assign an input to one of a plurality of classifications. "Fuzzy logic" is a computing algorithm that outputs truth values between 0 and 1 for each classification, e.g., in contrast to a Boolean logic algorithm that generates strict truth values of 0 or 1. That is, a fuzzy logic program 400 can assign more than one truth value to an input indicating a likelihood or probability that the input belongs to a respective one of the classifications associated to the assigned truth values. The fuzzy logic program 400 can be programming of the computer 110. Alternatively, the fuzzy logic program 400 can be programmed onto a dedicated module in the vehicle 105. Based on output of the fuzzy logic program 400, the computer 110 determines whether a trailer 200 is attached to the vehicle 105.

The fuzzy logic program 400 receives crisp data as input. In this context, a "crisp" input is a raw data value, i.e., a specific number, for a particular parameter, e.g., an electrical resistance value, a vehicle length value, a trailer length value, etc. In the example of FIG. 4, the fuzzy logic program 400 receives, as crisp inputs, length data 405 of the vehicle 105, electrical resistance data 410, and length data 415 of a trailer 200. The computer 110 can recall the length data 405 of the vehicle 105 as a value stored in a memory of the computer 110. Upon initially attaching a trailer 200 to the vehicle 105, the computer 110 can prompt the vehicle operator for the length data 415 of the trailer 200. The computer 110 can store the length data 415 in the memory of the computer 110. Then, upon collecting electrical resistance data 410, the computer 110 can recall the trailer length data 415 to determine whether a trailer 200 that has previously been attached to the vehicle (or is of a similar size to a trailer 200 that has been attached to the vehicle 105) is attached to the vehicle 105.

The computer 110 can apply fuzzy rules 420 to the crisp inputs 405, 410, 415. A "fuzzy rule" is a calculation that receives the crisp value as input and outputs a fuzzy value $\lambda$. As described above and shown in FIG. 3, each crisp value can be assigned to a classification. Each classification can have an upper bound and a lower bound. Example classifications for electrical resistance, vehicle length, and trailer length are shown in Tables 1-3 below:

TABLE 1

Electrical Resistance Classifications

| Classification | Resistance Value |
| --- | --- |
| Short Circuit | 0 Ω-2.6 Ω |
| Incandescent | 2.0 Ω-25 Ω |
| LED | 20 Ω-125 Ω |
| Gray Zone | 100 Ω-2 kΩ |
| Severe Corrosion | 1.5 kΩ-10 kΩ |
| Corrosion | 8 kΩ-70 kΩ |
| Open Circuit | >50 kΩ |

TABLE 2

Vehicle Length Classifications

| Classification | Length Value |
| --- | --- |
| Compact | 3.9 m-4.2 m |
| Crossover | 4.1 m-5.0 m |
| Truck | 4.8 m-5.8 m |
| Large Truck | 5.7 m-7.3 m |

TABLE 3

Trailer Length Classifications

| Classification | Length Value |
| --- | --- |
| Small | 1.8 m-4.2 m |
| Medium | 3.6 m-6.3 m |

TABLE 3-continued

Trailer Length Classifications

| Classification | Length Value |
| --- | --- |
| Large | 6.1 m-7.5 m |
| Extra Large | 7.2 m-9.1 m |

For a specified crisp value, a physical lamp 205, vehicle 105, or trailer 200 can be classified into one of two classifications if the crisp value is close to the lower bound of one classification and the upper bound of another classification. For example, as shown in Table 1 above, an electrical resistance value of 22Ω is below the upper bound of the "Incandescent" classification (25Ω) and above the lower bound of the "LED" classification (20Ω), indicating that a lamp 205 can be either an incandescent light or an LED. The fuzzy rules 420 account for the overlap between classifications by assigning a fuzzy value $\lambda$ for the classification based on the upper and lower bounds of the classifications. As described above, and as illustrated in Expression (1) below implementing a fuzzy rule 420, the fuzzy value $\lambda$ is a number between 0 and 1 that measures a likelihood or probability that a particular crisp input 405, 410, 415 should be assigned to a particular classification:

$$\lambda = \begin{cases} \dfrac{R - LB}{T_1 - LB} & \text{lower bound} < R < \text{first threshold} \\ 1 & \text{first threshold} \le R \le \text{second threshold} \\ \dfrac{UB - R}{UB - T_2} & \text{second threshold} < R < \text{upper bound} \end{cases} \quad (1)$$

where R is the crisp value (electrical resistance in the example of this equation), LB is the lower bound for the current classification, UB is the upper bound for the current classification, $T_1$ is a first threshold that accounts for the overlap between the current classification and another classification, and $T_2$ is a second threshold that accounts for the overlap between the current classification and yet another classification. For example, the first threshold $T_1$ can be an upper bound of the immediately lower classification that overlaps with the current classification, and the second threshold $T_2$ can be a lower bound of the immediately higher classification that overlaps with the current classification. For example, for the electrical resistance data 410, the "LED" classification has a lower bound LB=20, and upper bound UB=125, a first threshold $T_1$=25 (i.e., the upper bound of the "Incandescent" classification) and a second threshold $T_2$=100 (i.e., the lower bound of the "Gray Zone" classification).

Upon applying fuzzy rule(s) 420 and thus determining the fuzzy values $\lambda$, the computer 110 can assign classifications 425 to the crisp inputs 405, 410, 415. The computer 110 assigns the classifications by comparing the fuzzy values $\lambda$ to a predetermined threshold. When the fuzzy value $\lambda$ for a classification is above the predetermined threshold, the computer 110 assigns the crisp input 405, 410, 415 to that classification. For example, if the threshold is 0.70 for electrical resistance data, and the computer 110 identifies fuzzy values $\lambda_1$=0.15 for the "Incandescent" classification and $\lambda$=0.85 for the "LED" classification for an electrical resistance crisp input 410, the computer 110 assigns the classification "LED" to the crisp input 410. The threshold can be determined based on a minimum value above which the fuzzy value $\lambda$ indicates only one classification. When the crisp input overlaps between two classifications, the fuzzy value $\lambda_1$ for one classification determined based on Expression 1 above will be higher than the fuzzy value $\lambda_2$ for the other classification except for one intersection point at which the fuzzy values $\lambda_1=\lambda_2=\lambda^*$ are equal. That is, Expression 1 defines the fuzzy values $\lambda$ as linear equations defining lines starting at 0 and increasing to 1 at slopes defined by Expression 1, and the lines intersect at a value $\lambda^*$. In other words, the crisp input that outputs $\lambda^*$ can be classified to both of the classifications whose upper and lower bounds overlap. To prevent the computer 110 from identifying more than one classification for a crisp input, the computer 110 can determine the threshold for the fuzzy value $\lambda$ to be the highest intersection point $\lambda^*$ of the classifications, such that any fuzzy value $\lambda > \lambda^*$ indicates only one classification for a crisp input.

Based on the classifications, the computer 110 output a detection 430 of whether the trailer 200 is attached to the vehicle 105. Upon identifying the classifications, the computer 110 can refer to a lookup table or the like that correlates the electrical resistance classification, the trailer length classification, and the vehicle length classification to a specified determination of whether the trailer 200 is attached to the vehicle 105, such as Table 4 below:

TABLE 4

Trailer Detection for Truck class vehicle

| Resistance Classification | Trailer Classification | | | |
|---|---|---|---|---|
| | Small | Medium | Large | Extra Large |
| Short Circuit | YES | YES | YES | YES |
| Incandescent | NO | YES | YES | YES |
| LED | NO | NO | YES | YES |
| Gray Zone | NO | NO | NO | YES |
| Severe Corrosion | NO | NO | NO | NO |
| Corrosion | NO | NO | NO | NO |
| Open Circuit | NO | NO | NO | NO |

The lookup table or the like can be determined based on empirically testing lamps 205 and connectors 220 with test vehicles 105 and test trailers 200 attached and detached from the test vehicles 105. The empirical testing can include different types of lamps 205, e.g., LED and incandescent lamps, and different levels of corrosion, e.g., lightly corroded and severely corroded connectors 220. The lookup table or the like can be stored in the memory of the computer 110. Alternatively or additionally, the server 130 can transmit the lookup table or the like to the computer 110 via the network 125.

The computer 110 can determine that the trailer 200 is attached to the vehicle 105 based on all three of electrical resistance data, trailer length data, and vehicle length data. Alternatively, the computer 110 can determine whether the trailer 200 is attached to the vehicle 105 based on the output classification of the electrical resistance crisp inputs 410 and only one of the trailer length data or the vehicle length data. For example, when the output classification is the "Short Circuit" classification, the computer 110 can determine that the trailer 200 is attached to a "Truck" classified vehicle 105 regardless of the trailer length data. Table 4 illustrates that the computer 110 can output a detection 430 that the trailer 200 is attached upon determining the electrical resistance classification as "Short Circuit." That is, when the computer 110 detects a short circuit, the computer 110 can determine that a lamp 205 mounted to a trailer 200 caused the short circuit, and thus the trailer 200 is attached to the vehicle 105.

In another example, also shown in Table 4, when the output classification for the electrical resistance crisp inputs 410 is "Corrosion," the computer 110 can output a detection 430 that no trailer 200 is attached to the vehicle 105. That is, when the resistance data indicate that the connector 220 is corroded, the computer 110 can determine that no trailer 200 is attached to the vehicle 105, and the computer 110 can provide an output indicating that the connector 220 is corroded and may need to be replaced.

Upon determining that the trailer 200 is attached to the vehicle 105, the computer 110 can actuate one or more components 120 to move the vehicle 105 and the trailer 200. For example, when the vehicle 105 is moving in reverse, the computer 110 can actuate a steering and a propulsion to move the trailer 200 along a planned path, e.g., with a backup assist program such as Pro Trailer Backup Assist™ offered by Ford Motor Co. The computer 110 can actuate the backup assist program upon detecting the trailer 200 and can move the vehicle 105 in reverse without the backup assist feature when no trailer 200 is detected. The backup assist program determines a "trailer angle," i.e., an angle between a longitudinal axis of the trailer 200 and a longitudinal axis of the vehicle 105. The backup assist program actuates the propulsion and the steering to move the vehicle 105 and the trailer 200 in reverse while maintaining the trailer angle within a threshold of a specified trailer angle to move the trailer 200 along the planned path. Thus, the backup assist program actuates the propulsion and the steering such that the vehicle 105 and the trailer 200 move in a direction intended by an operator of the vehicle 105.

In another example, the computer 110 can adjust a blind spot subsystem, such as the Blind Spot Information System offered by Ford Motor Co., Dearborn, Mich., USA, upon detecting the trailer 200. The blind spot subsystem is a subsystem that includes one or more components 120 that can detect other vehicles 105 in a blind spot of the vehicle 105. The "blind spot" in this context is a portion of a roadway not visible by an operator in a side mirror of the vehicle 105. The blind spot subsystem, upon detecting another vehicle 105 in the blind spot, can provide an alert or other output to the operator of the vehicle 105. The trailer 200 can extend the blind spot farther behind the vehicle 105, blocking portions of the roadway that would otherwise be visible in the side mirror. Upon detecting that the trailer 200 is attached to the vehicle, the computer 110 can instruct the blind spot subsystem to actuate one or more components 120 to search for vehicles 105 in the blind spot caused by the trailer 200 blocking view of the side mirror. For example, the blind spot subsystem can include a camera, and the computer 110 can instruct the camera to collect image data from a portion of the roadway blocked from view of the side mirror by the trailer 200.

Figure 5:
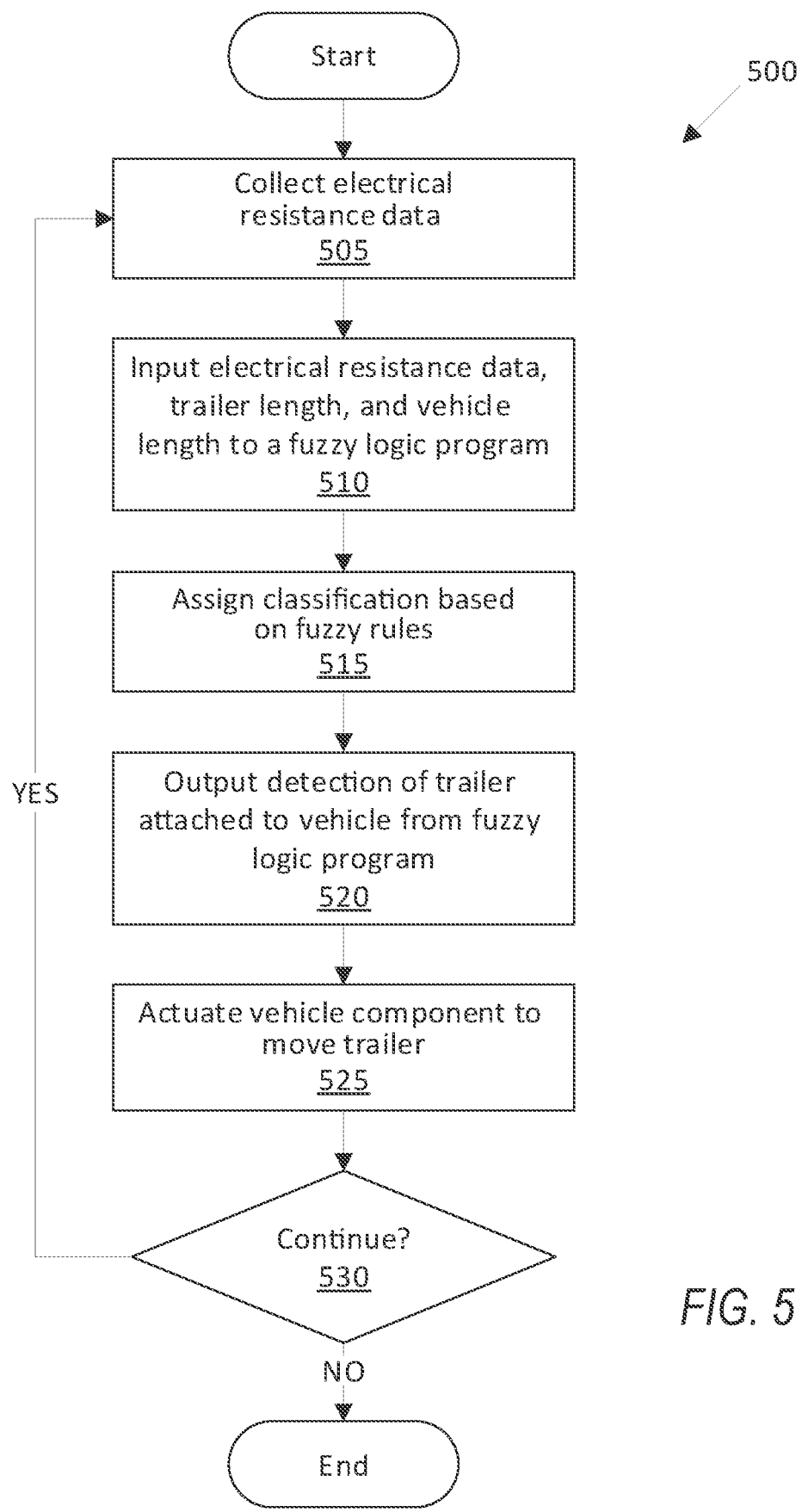
FIG. 5 is a block diagram of an example process for detecting the trailer attached to the vehicle.

FIG. 5 is a block diagram of an example process 500 for detecting a trailer 200 attached to a vehicle 105. The process 500 begins in a block 505, in which a computer 110 of the vehicle 105 collects electrical resistance data from a current flowing through a lamp 205 and a connector 220 connecting the trailer 200 to the vehicle 105. As described above, the computer 110 can receive electrical resistance data from the lamp 205 over an internal network, e.g., a CAN bus.

Next, in a block 510, the computer 110 can input the electrical resistance data, stored length data of the vehicle 105, and stored length data of a trailer 200 previously attached to the vehicle 105 to a fuzzy logic program. As described above, the electrical resistance data, the vehicle length data, and the trailer length data are crisp inputs to the fuzzy logic program, and the fuzzy logic program applies one or more fuzzy rules to the crisp inputs to assign the inputs to a classification. The fuzzy rules can be determined by, e.g., a manufacturer, and can be tuned to assign classifications to the crisp inputs to detect when the trailer 200 is attached to the vehicle 105.

Next, in a block 515, the computer 110 assigns a classification to each of the electrical resistance data, the vehicle length data, and the trailer length data based on the fuzzy rules. As described above, the computer 110 assigns each crisp input to a specific classification based on the value of the crisp input and the fuzzy rules. For example, the computer 110 can assign a crisp input of an electrical resistance data value of 20 Ohms to a fuzzy value λ of 0.75 to the "Incandescent" classification and a fuzzy value λ of 0.25 to the "LED" classification, indicating that the lamp 205 from which the electrical resistance value was collected is more likely to be an incandescent light than a light-emitting diode. The computer 110 can then determine that, because the fuzzy value for the "Incandescent" classification is above a threshold, the electrical resistance value should be assigned to the "Incandescent" classification.

Next, in a block 520, the computer 110 outputs a detection of whether the trailer 200 is attached to the vehicle 105 from the fuzzy logic program. As described above, the fuzzy logic program assigns a classification to each of the electrical resistance data, the vehicle length data, and the trailer length data. Based on the assigned classifications, the computer 110 determines whether the trailer 200 is attached to the vehicle 105. For example, as shown in Table 4 above, the computer 110 can determine that the trailer 200 is attached to the vehicle 105 when the vehicle classification is "Truck," the trailer classification is "Large" and the electrical resistance classification is "Incandescent." The computer 110 can store one or more lookup tables or the like that correlate a detection of the trailer 200 to the specified classifications of the electrical resistance data, the vehicle length data, and the trailer length data.

Next, in a block 525, the computer 110 actuates one or more components 120 upon detecting the trailer 200. For example, the computer 110 can actuate a backup assist program to control movement of the trailer 200 as the vehicle 105 moves in reverse. That is, the computer 110 can actuate a propulsion and a steering subsystem to move the vehicle 105 and the trailer 200 along a planned path.

Next, in a block 530, the computer 110 determines whether to continue the process 500. For example, the computer 110 can determine not to continue the process 500 when the vehicle 105 is stopped and powered down. If the computer 110 determines to continue, the process 500 returns to the block 505. Otherwise, the process 500 ends.

Computing devices discussed herein, including the computer 110, include processors and memories, the memories generally each including instructions executable by one or more computing devices such as those identified above, and for carrying out blocks or steps of processes described above. Computer executable instructions may be compiled or interpreted from computer programs created using a variety of programming languages and/or technologies, including, without limitation, and either alone or in combination, Java™, C, C++, Visual Basic, Java Script, Python, Perl, HTML, etc. In general, a processor (e.g., a microprocessor) receives instructions, e.g., from a memory, a computer readable medium, etc., and executes these instructions, thereby performing one or more processes, including one or more of the processes described herein. Such instructions and other data may be stored and transmitted using a variety of computer readable media. A file in the computer 110 is generally a collection of data stored on a computer readable medium, such as a storage medium, a random access memory, etc.

A computer readable medium includes any medium that participates in providing data (e.g., instructions), which may be read by a computer. Such a medium may take many forms, including, but not limited to, non volatile media, volatile media, etc. Non volatile media include, for example, optical or magnetic disks and other persistent memory. Volatile media include dynamic random access memory (DRAM), which typically constitutes a main memory. Common forms of computer readable media include, for example, a floppy disk, a flexible disk, hard disk, magnetic tape, any other magnetic medium, a CD ROM, DVD, any other optical medium, punch cards, paper tape, any other physical medium with patterns of holes, a RAM, a PROM, an EPROM, a FLASH EEPROM, any other memory chip or cartridge, or any other medium from which a computer can read.

With regard to the media, processes, systems, methods, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. For example, in the process 500, one or more of the steps could be omitted, or the steps could be executed in a different order than shown in FIG. 5. In other words, the descriptions of systems and/or processes herein are provided for the purpose of illustrating certain embodiments and should in no way be construed so as to limit the disclosed subject matter.

Accordingly, it is to be understood that the present disclosure, including the above description and the accompanying figures and below claims, is intended to be illustrative and not restrictive. Many embodiments and applications other than the examples provided would be apparent to those of skill in the art upon reading the above description. The scope of the invention should be determined, not with reference to the above description, but should instead be determined with reference to claims appended hereto and/or included in a non-provisional patent application based hereon, along with the full scope of equivalents to which such claims are entitled. It is anticipated and intended that future developments will occur in the arts discussed herein, and that the disclosed systems and methods will be incorporated into such future embodiments. In sum, it should be understood that the disclosed subject matter is capable of modification and variation.

The article "a" modifying a noun should be understood as meaning one or more unless stated otherwise, or context requires otherwise. The phrase "based on" encompasses being partly or entirely based on.

Ordinal adjectives such as "first" and "second" are used throughout this document as identifiers and are not intended to signify importance or order.

The invention claimed is:

1. A system, comprising a computer including a processor and a memory, the memory storing instructions executable by the processor to:
   determine an electrical resistance of a lamp in communication with the computer;
   determine a respective classification for each of the electrical resistance, a vehicle length, and a trailer length, each classification associated to a respective range of values of one of the electrical resistance, the vehicle length, or the trailer length;

based on a combination of the classifications, determine that a trailer is attached to a vehicle; and actuate one or more components of the vehicle to move the trailer.

2. The system of claim 1, wherein the instructions further include instructions to determine the electrical resistance of the lamp based on a voltage across the lamp or a current supplied to the lamp.

3. The system of claim 1, wherein the instructions further include instructions to determine that a connector connecting the vehicle to the trailer is corroded based on the classification.

4. The system of claim 3, wherein the instructions further include instructions to determine that the trailer is not attached to the vehicle upon determining that the connector is corroded.

5. The system of claim 1, wherein the instructions further include instructions to adjust a blind spot subsystem upon determining that the trailer is attached to the vehicle.

6. The system of claim 1, wherein the instructions further include instructions to actuate one or more components of the vehicle to move the trailer in reverse upon determining that the trailer is attached to the vehicle.

7. The system of claim 1, wherein the lamp is mounted to the trailer.

8. The system of claim 1, wherein the instructions further include instructions to determine the classifications with a fuzzy logic program.

9. The system of claim 8, wherein the fuzzy logic program outputs one of a plurality of classifications based on the vehicle length, the plurality of classifications including at least one of a compact classification, a crossover vehicle classification, or a truck classification.

10. The system of claim 8, wherein the fuzzy logic program outputs one of a plurality of classifications based on the electrical resistance, the plurality of classifications including at least one of an open circuit, a short circuit, a corroded connector, an incandescent lamp, or a light-emitting diode lamp.

11. The system of claim 10, wherein the instructions further include instructions to determine that the trailer is attached to the vehicle when the output classification is the short circuit classification and to determine that no trailer is attached to the vehicle when the output classification is the corroded classification.

12. The system of claim 1, wherein the instructions further include instructions to receive user input indicating the trailer length of the trailer.

13. A method, comprising:

determining an electrical resistance of a lamp;

determining a respective classification for each of the electrical resistance, a vehicle length, and a trailer length, each classification associated to a respected range of values of one of the electrical resistance, the vehicle length, or the trailer length;

based on a combination of the classifications, determining that a trailer is attached to a vehicle; and actuating one or more components of the vehicle to move the trailer.

14. The method of claim 13, further comprising determining that a connector connecting the trailer to the vehicle is corroded based on the classification.

15. The method of claim 14, further comprising determining that the trailer is not attached to the vehicle upon determining that the connector is corroded.

16. The method of claim 13, further comprising adjusting a blind spot subsystem upon determining that the trailer is attached to the vehicle.

17. The method of claim 13, further comprising determining the classifications with a fuzzy logic program.

18. The method of claim 17, wherein the fuzzy logic program outputs one of a plurality of classifications based on the vehicle length, the plurality of classifications including at least one of a compact classification, a crossover vehicle classification, or a truck classification.

19. The method of claim 17, wherein the fuzzy logic program outputs one of a plurality of classifications based on the electrical resistance, the plurality of classifications including at least one of an open circuit, a short circuit, a corroded connector, an incandescent lamp, or a light-emitting diode lamp.

20. The method of claim 19, further comprising determining that the trailer is attached to the vehicle when the output classification is the short circuit classification and determining that no trailer is attached to the vehicle when the output classification is the corroded lamp classification.

\* \* \* \* \*